(12) United States Patent
Badia

(10) Patent No.: US 10,386,045 B2
(45) Date of Patent: Aug. 20, 2019

(54) LUMINOUS MODULE FOR AN AUTOMOTIVE VEHICLE WITH CONNECTION TO GROUND

(71) Applicant: VALEO VISION, Bobigny (FR)

(72) Inventor: Olivier Badia, Bobigny (FR)

(73) Assignee: VALEO VISION, Bobigny (FR)

( * ) Notice: Subject to any disclaimer, the term of this patent is extended or adjusted under 35 U.S.C. 154(b) by 64 days.

(21) Appl. No.: 15/437,921

(22) Filed: Feb. 21, 2017

(65) Prior Publication Data
US 2017/0241624 A1    Aug. 24, 2017

(30) Foreign Application Priority Data
Feb. 22, 2016   (FR) ..................... 16 51409

(51) Int. Cl.
| | |
|---|---|
| *F21S 45/47* | (2018.01) |
| *F21V 19/00* | (2006.01) |
| *H05K 1/14* | (2006.01) |
| *H05K 1/18* | (2006.01) |
| *H05K 1/02* | (2006.01) |
| *H05K 3/00* | (2006.01) |
| *F21S 45/49* | (2018.01) |

(52) U.S. Cl.
CPC ............ *F21V 19/003* (2013.01); *F21S 45/47* (2018.01); *H05K 1/028* (2013.01); *H05K 1/0209* (2013.01); *H05K 1/0215* (2013.01); *H05K 1/147* (2013.01); *H05K 1/189* (2013.01); *F21S 45/49* (2018.01); *H05K 1/0204* (2013.01); *H05K 3/0061* (2013.01); *H05K 2201/055* (2013.01); *H05K 2201/056* (2013.01); *H05K 2201/066* (2013.01); *H05K 2201/10106* (2013.01); *H05K 2201/10401* (2013.01)

(58) Field of Classification Search
CPC ........ F21V 19/003; F21V 23/02; F21S 45/47; F21S 45/49; H05K 1/0215; H05K 1/189; H05K 1/0209; H05K 1/147; H05K 1/028; H05K 3/0061; H05K 2201/055; H05K 2201/056; H05K 1/0204; H05K 2201/066; H05K 2201/10106; H05K 2201/10401; F21Y 2115/30
See application file for complete search history.

(56) References Cited

U.S. PATENT DOCUMENTS

| | | | | |
|---|---|---|---|---|
| 2002/0130985 | A1* | 9/2002 | Weindorf | G02B 6/0068 349/61 |
| 2009/0285580 | A1* | 11/2009 | Yasuda | H05K 1/189 398/139 |
| 2013/0343054 | A1* | 12/2013 | Yang | F21V 23/00 362/249.01 |
| 2015/0036362 | A1* | 2/2015 | Van Gompel | H05K 3/0061 362/382 |
| 2017/0212317 | A1* | 7/2017 | Eichler-Neumann | H05K 1/147 |

\* cited by examiner

*Primary Examiner* — Y M. Lee
(74) *Attorney, Agent, or Firm* — Oblon, McClelland, Maier & Neustadt, L.L.P.

(57) ABSTRACT

The invention proposes a luminous module comprising a flexible printed circuit board. The connection to ground of the electronic circuit accommodated by the printed circuit board is produced without adding fastening parts dedicated to this role. Compared to known prior-art techniques, the invention allows a luminous module to be produced comprising fewer constituent parts and occupying a smaller volume.

12 Claims, 2 Drawing Sheets

LUMINOUS MODULE FOR AN AUTOMOTIVE VEHICLE WITH CONNECTION TO GROUND

The invention relates to the field of lighting and luminous signalling, in particular in automotive vehicles.

In the field of lighting and luminous signalling for automotive vehicles, it has become more and more frequent to use light sources comprising light-emitting semiconductor components, light-emitting diodes (LEDs) for example. An LED component emits light rays when a voltage of a value at least equal to a threshold value called the turn-on voltage is applied to these terminals.

As is known, one or more LEDs of a luminous module for an automotive vehicle are powered by way of supply-controlling means, which comprise converter circuits. The supply-controlling means are configured to convert an electrical current of a first magnitude, for example delivered by a current source of the automotive vehicle, such as a battery, into a load current having a second magnitude that is different from the first. The electronic circuits forming the supply-controlling means, and the circuits comprising the light sources themselves may, as is known, be produced on flexible printed circuit boards (FPCBs). With respect to a rigid printed circuit board, an FPCB has the advantage of being foldable, thereby making it easier to place in the restricted volume available within a luminous device of an automotive vehicle. The electronic circuits produced on a face of an FPCB may nevertheless require a connection to zero potential, or ground. For this purpose, it is for example known to provide electrically conductive rivets that pierce the flexible board in preset locations, and make contact with a grounded element. The usable area of the printed circuit board is therefore partially occupied by components the only function of which is connection to ground.

The objective of the invention is to propose a solution that mitigates at least one of the aforementioned disadvantages. More particularly, the invention proposes a luminous module comprising a flexible printed circuit board that allows a connection to ground while limiting the volume occupied by the elements that form the connection to ground with respect to known solutions.

One subject of the invention is a luminous module for an automotive vehicle. The luminous module comprises a metal device representing the ground, and an assembly comprising a flexible printed circuit board accommodating an electronic circuit. The luminous module also comprises at least one support plate. The assembly is placed on a surface of the metal device. The flexible board comprises a first board section that bears on a first face the electronic components of the electronic circuit, and that makes contact, via a second face that is opposite the first face, with said support plate, so that the first board section is rigidified. The luminous module is noteworthy in that the flexible board comprises a second board section that comprises at least one electrically conductive track on a first face, and that is bounded by a single fold with respect to the first board section, the fold being such that the second board section makes contact with said support plate and such that the electrically conductive track forms a connection to ground.

The first board section may have the shape of a strip having a length and a width, the width being smaller than the length. The second portion may be provided in the form of a tongue widening the width of the board over a portion of its length.

Preferably, the support plate is stiffer than the flexible board.

Preferably, the second board section may be folded in the direction of the second face of the first board section.

The support plate may preferably be enveloped by the first and second board sections.

Preferably, the electrically conductive track of the first face of the second board section may make electrical contact with the surface of the metal device.

Preferably, the support plate may be electrically conductive. The support plate may preferably comprise aluminium.

The support plate may preferably comprise two portions that extend in planes that are generally parallel to the surface of the metal device, and comprising a first portion a first face of which makes contact with the second face of the first board section and a second face of which, opposite the first, makes contact with the surface of the metal device, and a second portion making contact with the electrically conductive track of the first face of the second board section.

The fold of the board may preferably be such that the first board section and the second board section extend beside one another in planes that are generally parallel to the surface of the metal device.

Preferably, the support plate may comprise an aperture allowing the passage of the flexible board level with the fold. It may for example be a slot.

The metal device may preferably be part of a heat-dissipating means of the module. It may for example be a radiator intended to dissipate the heat produced by the electronic components of the electronic circuit.

Preferably, the contacts between the board and the support plate and/or the surface of the metal device may be produced using a thermally conductive adhesive. The contacts between the support plate and the board and/or the surface of the metal device may preferably be produced using a thermally conductive adhesive. The adhesive is advantageously electrically conductive.

The flexible board or the support plate may preferably be fastened to the metal device using at least one rivet piercing the board or the support plate. This fastening may be achieved by crimping with a stud.

Preferably, the electronic circuit may comprise means for controlling the power supply of at least one light source of the luminous module. The electronic circuit may preferably comprise at least one light source, for example comprising one or more semiconductor elements. It may, for example, be a question of an LED or a laser diode.

Employing the measures according to the present invention, it becomes possible to form a contact to ground for an electronic circuit implanted on one side of an FPCB, using the flexibility of the printed circuit board, and without having to make recourse to additional components dedicated to this role. Thus, the solution proposed by the invention allows a connection to ground to be formed using fewer parts in comparison to existing solutions. With respect to known solutions, the invention avoids the manual placement of two rivets in the flexible and fragile printed circuit board, and avoids the need to flip the latter by means of two folds. This implies a lower production cost and a volume saving in the restricted space available for the conception of a luminous device for an automotive vehicle.

Other features and advantages of the present invention will be better understood by virtue of the description and drawings, in which.

Figure 1:
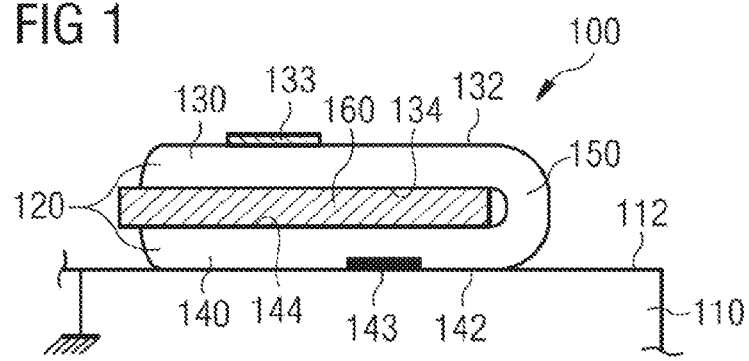
FIG. 1 shows a schematic illustration of a lateral cross section through a flexible board and a support plate in one preferred embodiment of a luminous module according to the invention.

In the description that follows, similar reference numbers will be used to describe similar concepts throughout the various embodiments of the invention. Thus, the reference numbers 100, 200, 300, 400 describe a luminous module in four different embodiments according to the invention.

Unless specifically indicated otherwise, technical features described in detail for one given embodiment may be combined with the technical features described in the context of other embodiments described by way of example and nonlimitingly.

The elements shown in the drawings are not to scale and have been simplified to increase the clarity of the description.

Flexible printed circuit boards (FPCBs) are known per se in the art. Their production will not be described in detail in the context of the present invention. Typically, the components of an electronic circuit implanted on an FPCB are placed on a first face of the board and connected by electrically conductive tracks provided on the surface of the board. In order to guarantee the durability of such an assemblage, the flexible board is, as is known, locally rigidified by adhesively bonding a support plate to the second face of the flexible board, i.e. the face opposite the face that bears the electronic circuit of the flexible board.

FIG. 1 schematises a luminous module 100 according to one embodiment according to the invention. A lateral cross section is shown. Only those components that are essential to the comprehension of the invention have been shown. A luminous module may however comprise other components than those illustrated. The module comprises a metal device 110 representing the ground. Advantageously, it is a heat-dissipating means of the luminous module, for example a radiator made of a metal such as aluminium. The module comprises an assembly that includes a flexible printed circuit board 120 and a support plate 160. The support plate is intended to rigidify the flexible board in the place corresponding to the location of the components of an electronics circuit. Ideally, the support plate is adhesively bonded to the board. The thickness of the flexible board 120 has been exaggerated with respect to the thickness of the plate for the sake of clarity of the description. The FPCB accommodates an electronic circuit the electronic components 133 of which have been shown. It is for example a question of light-emitting diode (LED) light sources. The assembly is placed on a surface 112 of the metal device. The electronic components 133 are borne on a first face 132 of a first board section 130. The second face 134 of the first board section, opposite the first face 132, makes contact with the support plate 160. The flexible board comprises a second board section 140 having a first face 142 and a second face 144.

When the board is in a flat state, the first faces 132 and 142 of the first and second board sections form a continuous surface in one and the same plane. In FIG. 1, the second board section 140 is folded with respect to the first board section 130. A single fold 150 bounds the two sections. The fold is such that the second board section makes contact, in particular via its second surface 144, with the support plate and via its first surface 142 with the metal device. As this first surface 142 includes an electrically conductive track 143 connected to the electronic circuit, a connection to ground is thus formed without using additional components.

Figure 2:
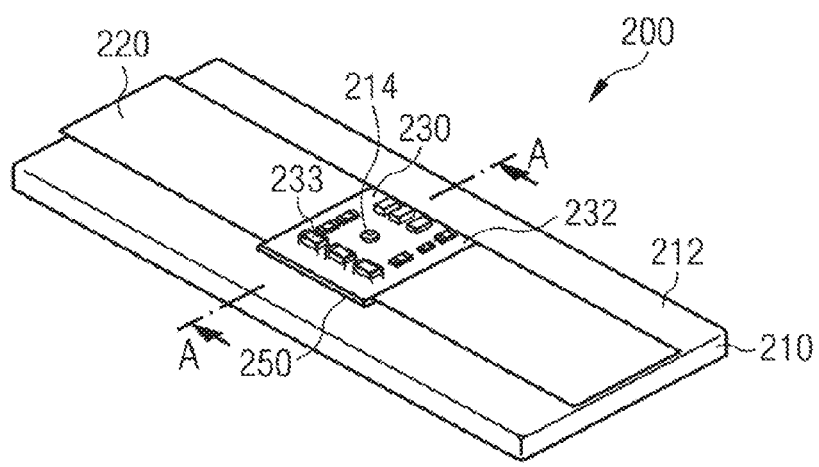
FIG. 2 shows an illustration in perspective of a luminous module according to one preferred embodiment of the invention.

FIG. 2 shows a perspective view of one variant of the embodiment shown by FIG. 1. The module 200 comprises a metal device 210 representing the ground. The module comprises an assembly that includes a flexible printed circuit board 220 and a support plate that has not been shown. The FPCB accommodates an electronic circuit the electronic components 233 of which have been shown. The assembly is placed on a surface 212 of the metal device. The electronic components 233 are borne on a first face 232 of a first board section 230. A fold 250 connects the first board section to a second section that cannot be seen in FIG. 2. A fastening rivet 214 is provided to fasten the assembly to the metal device. It is not necessary for the rivet, or crimping stud, to be electrically conductive.

Figure 3:
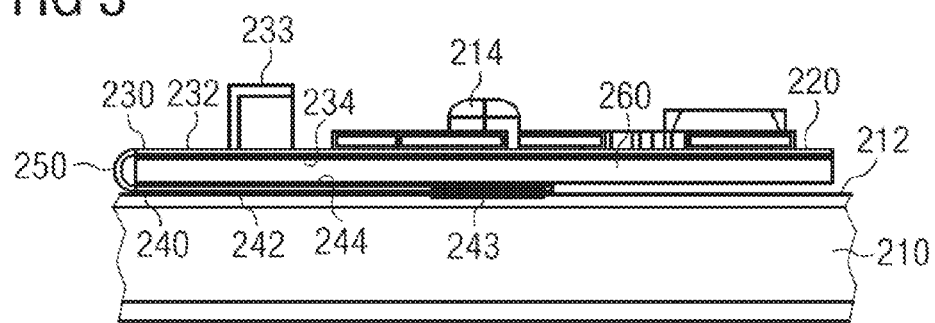
FIG. 3 shows a cross section along the axis A-A of the module illustrated by FIG. 2.

FIG. 3 shows a cross section of the module 200 level with the line A-A. The support plate 260 may be seen therein, said plate being partially enveloped by the first board section 230, the fold 250 and the second board section 240. The second face 234 of the first board section 230 makes contact with the support plate 260. Ideally, a thermally conductive adhesive is provided at this interface. The second board section 240 is folded in the direction of the second face 234 of the first section 230, so as to envelop the support plate 260, which makes contact with the second face 244 of the second board section 240. On the first face 242 of the second board section, which makes contact with the surface 212 of the metal device 210, an electrically conductive track 243 is provided connected to the electronic circuit accommodated on the board 220. This arrangement forms the connection to ground without specific components dedicated to this role. Ideally, a thermally conductive adhesive is provided at the interface of the surfaces 212 and 242, in order to guarantee heat exchange between the board 220 and the metal element 210.

During the mounting of the module 200, the electronic components 233 are firstly placed on the board, the first section 230 of which is then adhesively bonded to the support plate 260, the dimensions (width, length) of which are advantageously substantially equal to those of the first board section 230. The second section 240 of the board is then folded onto the support plate and adhesively bonded thereto. The assembly is then fastened, by adhesive bonding and/or crimping to the radiator 210.

Figure 4A:
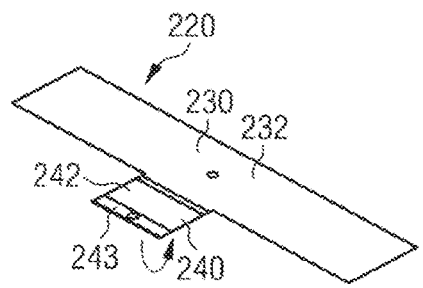
FIGS. 4a and 4b show a detail, in particular a flexible board, according to one preferred embodiment of the invention.
Figure 4B:
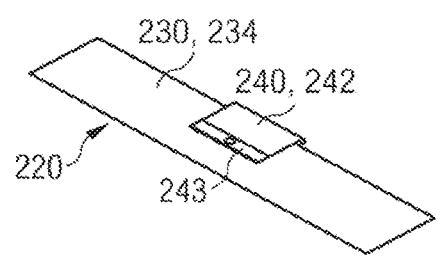

FIG. 4a shows the flexible board 220 in an unfolded state as seen from above. Neither the support plate, nor the metal device have been illustrated. The board 220 comprises a first section 230 and a second section 240. The first face of the board is also separated into a first section 232 and a second section 242. The first face of the second board section 242 comprises the electrically conductive track that is intended to make contact with the metal element representing the ground. FIG. 4b shows the flexible board 220 seen from below, in a folded state. In particular, the tongue representing the second board section 240 has been folded in the direction of the second face 234 of the first board section.

Figure 5:
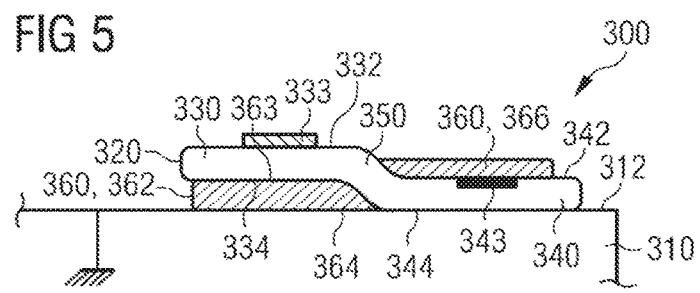
FIG. 5 shows a schematic illustration of a lateral cross section through a flexible board and a support plate in one preferred embodiment of a luminous module according to the invention.

FIG. 5 schematises a luminous module 300 according to another embodiment according to the invention. A lateral cross section has been shown. Only those components that are essential to the comprehension of the invention have been shown. The module comprises a metal device 310 representing the ground. Advantageously, it is a heat-dissipating means of the luminous module, for example a radiator made of a metal such as aluminium. The module comprises an assembly that includes a flexible printed circuit board 320 and an electrically conductive support plate 360. The support plate is intended to rigidify the flexible board in the place corresponding to the location of the components of an electronic circuit.

Ideally, the support plate is adhesively bonded to the board. The thickness of the flexible board 320 has been exaggerated with respect to the thickness of the plate for the sake of clarity of the description. The FPCB accommodates an electronic circuit the electronic components 333 of which have been shown. It is for example a question of light-emitting diode (LED) light sources. The assembly is placed on a surface 312 of the metal device. The electronic components 333 are borne on a first face 332 of a first board section 330. The second face 334 of the first board section, opposite the first face 332, makes contact with the support plate 360. The flexible board comprises a second board section 340 having a first face 342 and a second face 344. When the board is in a flat state, the first faces 332 and 342 of the first and second board sections form a continuous surface in one and the same plane. In FIG. 5, the second board section 340 is folded with respect to the first board section 330. A single fold 350 bounds the two sections. The fold 350 is such that the first board section 330 and the second board section 340 extend beside one another in planes that are generally parallel to the surface of the metal device 312. The planes are located at different heights with respect to the surface 312.

On the one hand, the second face 334 of the first board section 330 makes contact with a first portion of the support plate 363, which is interposed between the surface 312 and the board 320. The second face 334 of the first board section makes contact with the first face 363 of the first portion 362 of the support plate. The second face 364 of the first board section makes contact with the surface 312. The respective interfaces are ideally provided with a layer of thermally conductive adhesive.

On the other hand, the first face 342 of the second board section 340 makes contact with a second portion of the support plate 366. The second board section 340 is interposed between the surface 312 and the support plate. Ideally, the respective interfaces are provided with a thermally and electrically conductive adhesive. The arrangement is such that the first face 342 comprises an electrically conductive track 343 that makes contact with the support plate 360. The first portion 362 of the electrically conductive support plate is connected to ground via its contact with the surface 312. The connection to ground is therefore achieved via the electrically conductive track 343 that makes contact with the second portion 366 of the support plate.

Figure 6:
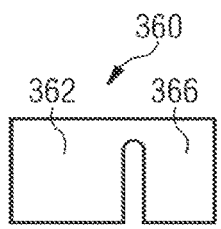
FIG. 6 shows a detail, in particular a support plate, according to one preferred embodiment of the invention.

FIG. 6 shows a view from above of a support plate 360 comprising the two described portions 362 and 366, respectively. The support plate is preferably a metal plate, for example a plate made of aluminium. The two portions of the plate are preferably separated by an aperture, such as a slot that allows the passage of the flexible board, whereas the two portions are electrically connected.

Figure 7:
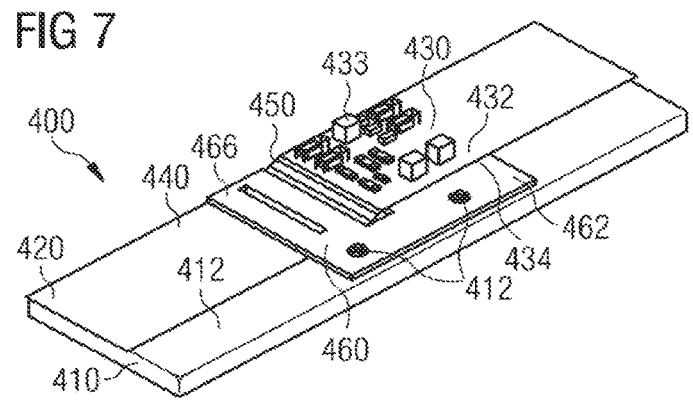
FIG. 7 shows an illustration in perspective of a luminous module according to one preferred embodiment of the invention.

FIG. 7 shows a perspective view of a variant of the embodiment shown by FIG. 5. The module 400 comprises a metal device 410 representing the ground. The module comprises an assembly that includes a flexible printed circuit board 420 and a support plate 460 having two distinct portions 462, 466. The FPCB accommodates an electronic circuit the electronic components 433 of which have been shown. The assembly is placed on a surface 412 of the metal device. The electronic components 433 are borne on a first face 432 of a first board section 430. The first board section 430 is rigidified by the first portion 462 of the support plate 460. A fold 450 connects the first board section to a second section 440. In the direction from right to left in FIG. 7, the fold makes the board 460 pass under the second portion 466 of the support plate 460. At least one fastening rivet 412 is provided to fasten the assembly to the metal device. It is not necessary for the rivet, or crimping stud, to be electrically conductive. The one or more rivets may be located level with the board, or, as illustrated, in a section of the support plate that connects the two portions thereof. The illustration shows that the two portions of the support plate extend in one and the same plane.

During the mounting of the module 400, the electronic components 433 are first placed on the board. The board is then folded in order for it to be possible to adhesively bond the first section 430 to the first portion 462 of the support plate 260. The second section 440 of the board is then passed through the aperture of the support plate in order to be adhesively bonded under the second section 266 of the support plate. The assembly is then fastened, by adhesive bonding and/or crimping to the metal device 410.

The invention claimed is:

1. A luminous module for an automotive vehicle, comprising:
    a metal device representing ground, and
    an assembly comprising a flexible printed circuit board accommodating an electronic circuit, and at least one support plate, the assembly being placed on a surface of the metal device,
    wherein the flexible board comprises:
        a first board section that bears on a first face at least one electronic component of the electronic circuit, and that makes contact, via a second face that is opposite the first face, with said support plate so that the first board section is rigidified,
    wherein the flexible board comprises a second board section that comprises a single electrically conductive track on a first face, and that is bounded by a single fold with respect to the first board section, the fold being such that the second board section makes contact with said support plate and such that the single electrically conductive track forms a connection to the ground on the metal device,
    the support plate is electrically conductive, and
    the support plate comprises two portions that extend in planes that are generally parallel to the surface of the metal device, including:
        a first portion of a first face of which makes contact with the second face of the first board section and a second face of which, opposite the first, makes contact with the surface of the metal device, and
        a second portion making contact with the single electrically conductive track of the first face of the second board section.

2. The luminous module according to claim 1, wherein the second board section is folded in the direction of the second face of the first board section.

3. The luminous module according to claim 2, wherein the support plate is enveloped by the first and second board sections.

4. The luminous module according to claim 2, wherein the single electrically conductive track of the first face of the second board section makes electrical contact with the surface of the metal device.

5. The luminous module according to claim 1, wherein the fold of the board is such that the first board section and the second board section extend beside one another in planes that are generally parallel to the surface of the metal device.

6. The luminous module according to claim 1, wherein the support plate comprises an aperture allowing the passage of the flexible board level with the fold.

7. The luminous module according to claim 1, wherein the metal device is part of a heat-dissipating means of the module.

8. The luminous module according to claim 1, wherein the contacts between at least one of the board and the support plate or the surface of the metal device are produced using a thermally conductive adhesive.

9. The luminous module according to claim 1, wherein the contacts between at least one of the support plate and the board or the surface of the metal device are produced using a thermally conductive adhesive.

10. The luminous module according to claim 1, wherein the flexible board or the support plate is fastened to the metal device using at least one rivet piercing the board or the support plate.

11. The luminous module according to claim 1, wherein the electronic circuit comprises means for controlling the power supply of at least one light source of the luminous module.

12. The luminous module according to claim 1, wherein the electronic circuit comprises at least one light source comprising one or more semiconductor elements.

\* \* \* \* \*